United States Patent [19]

Gibson

[11] Patent Number: 4,547,737

[45] Date of Patent: Oct. 15, 1985

[54] DEMODULATOR OF SAMPLED DATA FM SIGNALS FROM SETS OF FOUR SUCCESSIVE SAMPLES

[75] Inventor: John J. Gibson, Princeton, N.J.

[73] Assignee: RCA Corporation, Princeton, N.J.

[21] Appl. No.: 518,806

[22] Filed: Jul. 29, 1983

[51] Int. Cl.⁴ .......................... H03D 3/18; H03D 3/00
[52] U.S. Cl. ...................................... 329/50; 329/110; 329/126; 329/137; 329/145; 375/80; 455/214; 455/337
[58] Field of Search ................. 329/50, 110, 122, 126, 329/137, 145; 375/80, 94; 455/214, 337

[56] References Cited

U.S. PATENT DOCUMENTS

| | | | |
|---|---|---|---|
| 3,135,917 | 6/1964 | Best et al. ...................... | 329/137 X |
| 3,470,478 | 9/1969 | Crafts .............................. | 375/79 |
| 4,224,575 | 9/1980 | Mosley et al. .................. | 329/50 |
| 4,242,641 | 12/1980 | Houdard ........................ | 329/126 |
| 4,286,223 | 8/1981 | Shearer .......................... | 329/50 |
| 4,338,579 | 7/1982 | Rhodes ........................... | 332/21 |
| 4,344,039 | 8/1982 | Sugiura et al. ................. | 329/50 |
| 4,345,211 | 8/1982 | Longworth ..................... | 329/50 |
| 4,368,434 | 1/1983 | Miller et al. .................... | 329/50 |
| 4,455,533 | 6/1984 | Moraillon ....................... | 329/126 |

FOREIGN PATENT DOCUMENTS

| | | |
|---|---|---|
| 0037317 | 10/1981 | European Pat. Off. .............. 329/50 |
| 0058050 | 8/1982 | European Pat. Off. . |
| 0068571 | 1/1983 | European Pat. Off. . |
| 0068579 | 1/1983 | European Pat. Off. . |
| 0075071 | 3/1983 | European Pat. Off. . |
| 0080157 | 6/1983 | European Pat. Off. . |
| 3145919 | 4/1983 | Fed. Rep. of Germany ...... 329/110 |
| 3138464 | 4/1983 | Fed. Rep. of Germany . |
| 0140705 | 11/1981 | Japan ................................. 329/110 |
| 2082857 | 3/1982 | United Kingdom . |

OTHER PUBLICATIONS

F. G. A. Coupe, "Digital Frequency Discriminator", Electronics Letters, Aug. 1979, vol. 15, No. 16, pp. 489-490.
S. Schepers, "Wie Demoduliert man Digitalisierte FM-Träger?", Funk-Technik 37 (1982) Heft 10, pp. 418-420.
P. Draheim, "Digitalisierung der Video-Signalverarbeitung Beispiel: Video-Kassettenrecorder", Elektronik, 10/21/82, pp. 121-124.
Mattei et al., "Symbol Synchronizer for MPSK Signals" U.S. Ser. No. 340,771, filed Jan. 1, 1982.

Primary Examiner—Eugene R. LaRoche
Assistant Examiner—D. C. Mis
Attorney, Agent, or Firm—E. M. Whitacre; P. J. Rasmussen; E. P. Herrmann

[57] ABSTRACT

An FM signal is demodulated by the technique of sequentially sampling the signal and combining the samples to approximate the standard formula for the instantaneous frequency deviation $$F_n = (\tfrac{1}{2}\pi)\frac{\dot{x}_n y_n - \dot{y}_n x_n}{x_n^2 + y_n^2}$$

where the dots indicate the first derivative of the samples. The FM signal is assynchronously sampled at approximately four times the carrier frequency rate. Alternate samples are substantially equivalent to orthogonal components x and y of the FM signal. At least four successive samples are successsively stored so that at least four of the lastmost samples are always available for processing. Particular x samples are summed to create averaged samples $\bar{x}_n$ and differenced to create approximations of derivatives $\dot{x}_n$ of the x signal components and particular y samples are similarly summed and differenced to create averaged values $\bar{y}_n$ and derivatives $\dot{y}_n$. These values are used in the equation for $F_n$. In terms of successive samples, S, the equation for $F_n$ becomes $$F_n = (S_{n-1}S_{n+2} - S_n S_{n+1})/((S_{n-1} - S_{n+1})^2 - (S_n - S_{n+2})^2).$$

18 Claims, 4 Drawing Figures

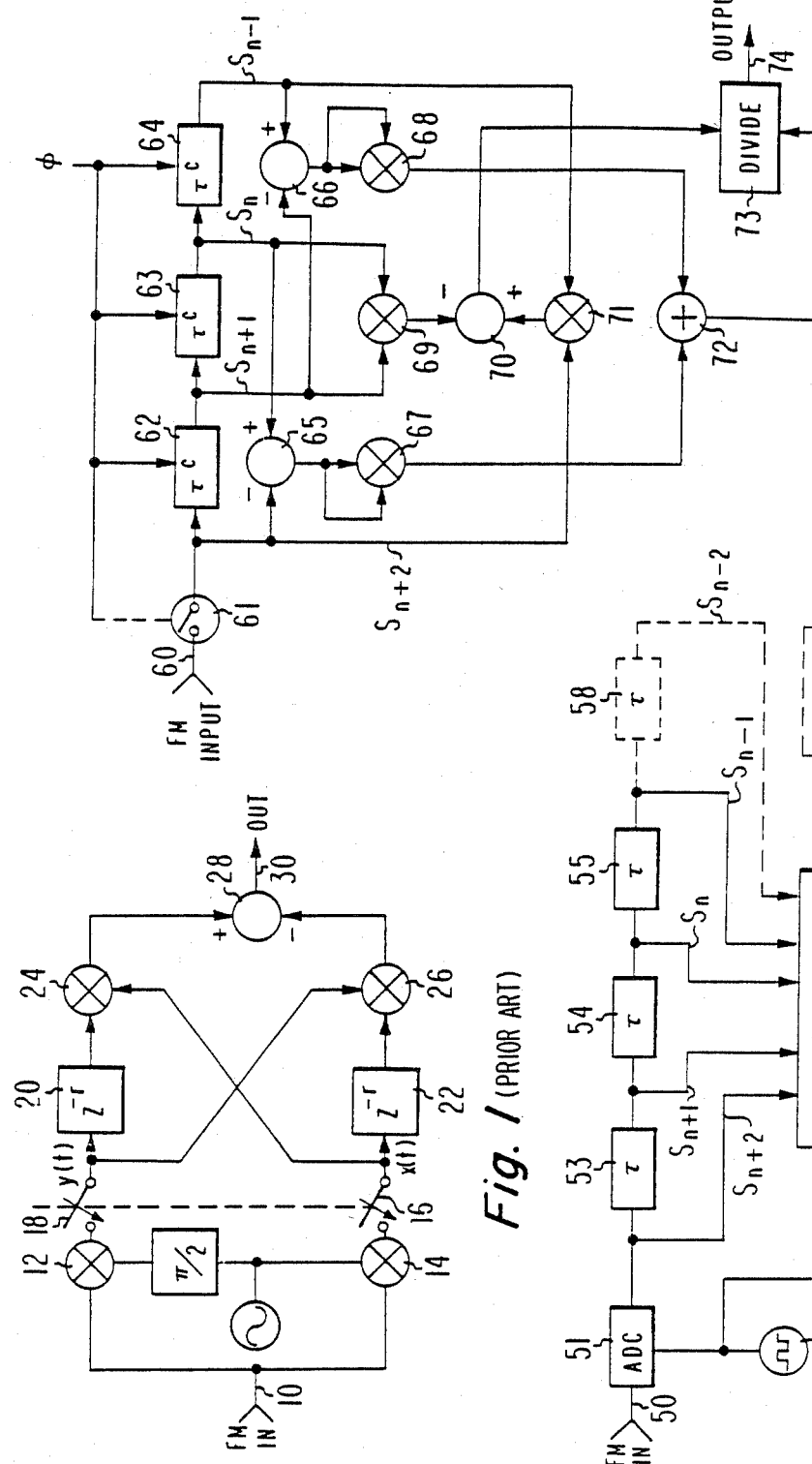
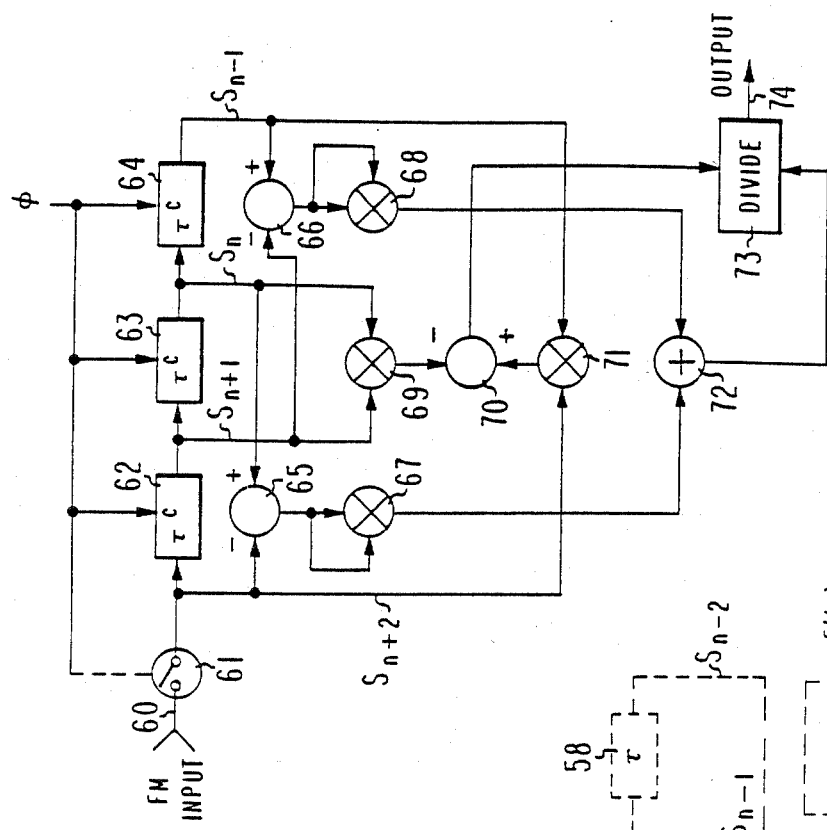
Fig. 3
Fig. 1 (PRIOR ART)
Fig. 2

DEMODULATOR OF SAMPLED DATA FM SIGNALS FROM SETS OF FOUR SUCCESSIVE SAMPLES

The present invention relates to detecting the instantaneous frequency of a signal with particular emphasis on digital demodulation of a frequency modulated signal.

FM discriminators or demodulators are widely used in analog systems, particularly in radio and television receivers. There is currently a trend toward developing digital techniques for processing the information signals in such receivers. Because the transfer functions of digital circuits are well defined and stable with temperature and supply variations, it is desirable to perform as much of the signal processing as possible in the digital domain. Thus there is currently developing a need for a digital demodulator of FM carriers.

F. G. A. Coupe in a paper entitled "Digital Frequency Discriminator" (Electronics Letters, Vol. 15, No. 16, August 1979, pp. 489-490) describes a circuit for demodulating a FM signal using digital techniques. In the Coupe circuit the FM signal is first operated on by a Hilbert transform to derive the orthogonal components x(t) and y(t) of the complex signal $$f(t) = x(t) + jy(t) \quad (1)$$

$$= a(t) \exp\{j\theta(t)\} \quad (2)$$

where $$\theta(t) = \tan^{-1}\{y(t)/x(t)\} \quad (3)$$

The x and y components are simultaneously sampled to develope samples x(t) and y(t). The x(t) and y(t) samples are applied to x and y processing channels. The signal of interest F(t) is derived from the first derivative of $\theta(t)$ with respect to time and given by:

$$F = (\tfrac{1}{2}\pi)d\theta(t)/dt = (\tfrac{1}{2}\pi)\frac{x\dot{y} - y\dot{x}}{x^2 + y^2} \quad (4)$$

where the dots represent the differential operator d/dt. The first derivatives $\dot{x}$ and $\dot{y}$ are approximated by the difference values of successive samples in the x sample channel and the y sample channel, i.e., $\dot{x}=x(n+1)-x(n)$ and $\dot{y}=y(n+1)-y(n)$ etc., the value n being an index denoting the number or occurrence of a particular sample.

These derivatives are appropriately substituted into equation (4) to produce the values, $$F(nt) \cong x(n)((y(n-1) - y(n)) + y(n)((x(n-1) - x(n)) \quad (5)$$

$$\cong y(n)x(n-1) - x(n)y(n-1) \quad (6)$$

In equation (5) it will be noted that the denominator of equation (4) was not computed since it corresponds to the amplitude of the FM signal and is presumed to be held at a predetermined constant value which simply scales the demodulated sample values by a constant. Collecting terms in equation (5) produces equation (6) which is seen to be a function of only four samples, two successive x(t) samples and two corresponding y(t) samples. The algorithm suggested by equation (6) for demodulating FM signals is quite simple to implement.

The disadvantage to this approach is the need to develop the complex values x(t) and y(t) by multiplying the input signal waveform by quadrature related signals.

SUMMARY OF THE INVENTION

In one embodiment of the present invention, sampling is performed by an analog-to-digital converter (ADC) which produces binary representations of the input signal. These binary representations are applied to a serial-parallel delay line wherein at least four samples may be accessed. The first and fourth of the successive samples in the delay line are applied to a first MULTIPLIER circuit to generate their product, and the second and third successive samples in the delay line are applied to a second MULTIPLIER circuit to concurrently generate their product. The products from the first and second MULTIPLIERS are applied to an ADDER circuit which produces processed samples $F_n$ proportional to a corresponding demodulated sample and given by $$F_n = S_{n-1}S_{n+2} - S_n S_{n+1} \quad (7)$$

BRIEF DESCRIPTION OF THE DRAWINGS

FIG. 1 is a schematic diagram of a known sampled data frequency discriminator.

FIGS. 2, 3 and 4 are block diagrams of sampled data FM demodulators according to the present invention.

DETAILED DESCRIPTION

Figure 4:
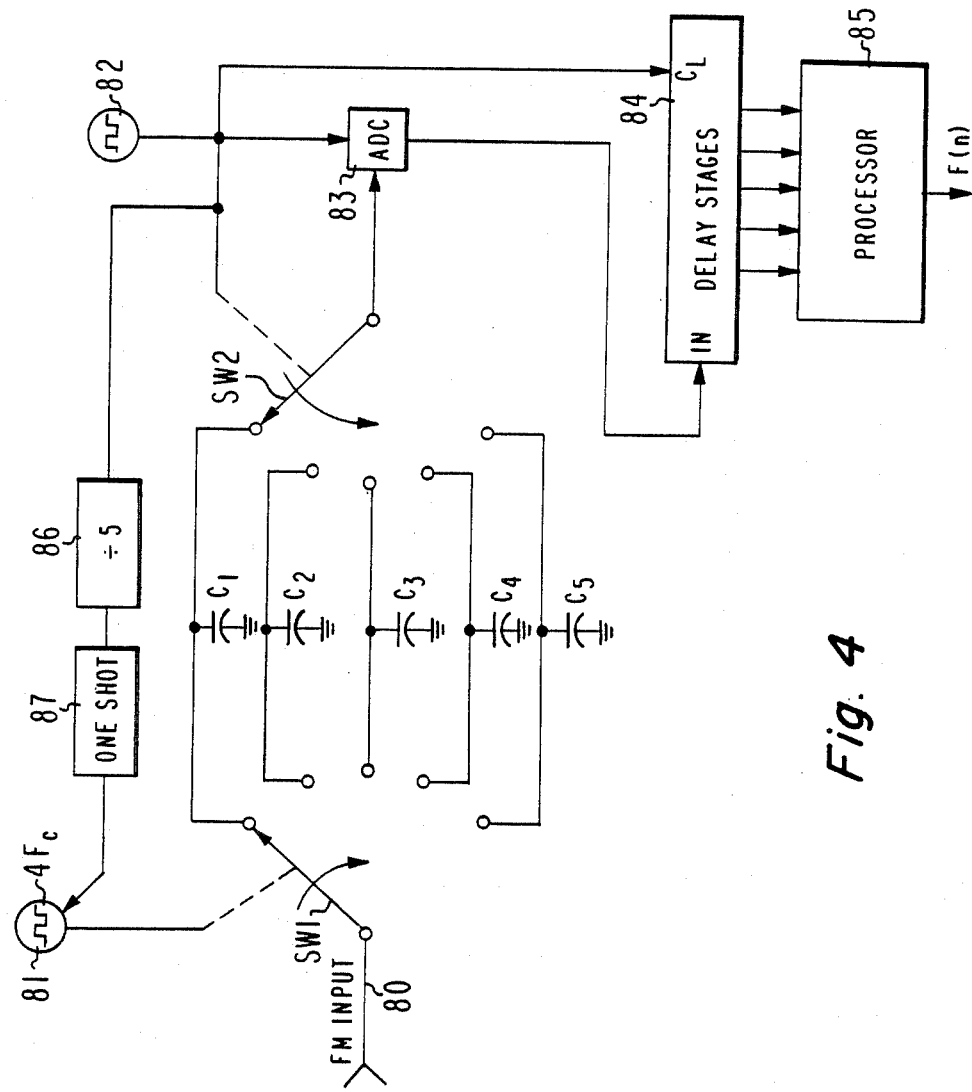

The circuit illustrated in FIG. 1 is of the type credited to Coupe and described in the foregoing background of the present invention. In this arrangement an analog FM signal which is applied at terminal 10 is mixed with quadrature related signals in multipliers 12 and 14 to produce the quadrature signals y(t) and x(t) respectively. The signals x(t) and y(t) are simultaneously sampled by switches 16 and 18. The sampled signal, y(n), is applied to a sampled data delay element 20 and to multiplier circuit 26. The sampled signal x(n) is applied to sampled data delay element 22 and to multiplier circuit 24. Delayed signals y(n) and x(n) from delay elements 20 and 22 are applied to multiplier circuits 24 and 26 respectively which generate the products $x(n)y(n-r)$ and $y(n)x(n-r)$ where r denotes the delay time that the signals incur in the delay elements, r generally being an integral number of sample periods in duration. The products from multipliers 24 and 26 are applied to a subtraction circuit 28 which produces the differences $$F(n) = y(n)x(n-r) - x(n)y(n-r) \quad (6)$$

and which correspond to a scaled version of the demodulated FM signal (assuming the amplitude of the signal applied to terminal 10 is constant).

The values $F_n$ given by equation (6) are approximations since the derivatives x and y are skewed in time with respect to the particular x and y values. This may be seen by examining Table I which indicates the time relationship of the respective samples.

TABLE I

| time | $t_{n-1}$ | $t_n$ | $t_{n+1}$ |
|---|---|---|---|
| x samples | $x_{n-1}$ | $x_n$ | $x_{n+1}$ |
| y samples | $y_{n-1}$ | $y_n$ | $y_{n+1}$ |

The samples $F_n$ are calculated for the x and y samples equal to $x_n$ and $y_n$ at time $T_n$. The derivatives used in the calculation are proportional to the linear differences of the succeeding and current samples, i.e. $x_{n-1}-x_n$ and $y_{n-1}-y_n$, which values tend to represent the slope of the waveform at times midway between the sample periods and not at the end points. A further disadvantage of the system is the need to produce the complex input signals by the multiplication of the received signal by the quadrature signals.

These shortcomings are substantially overcome in the present invention.

In general, any signal S(t) including FM signals may be described by the equation $$S(t) = x(t)\cos(f_s t\pi/2) - y(t)\sin(f_s t\pi/2) \quad (7)$$

$$= \sqrt{x^2 + y^2} \cos(2\pi f_s t + \tan^{-1}(y/x)) \quad (8)$$

where $f_s$ is an arbitrary frequency. In this invention $f_s$ will be referred to as the sample rate. The sample rate $f_s$ will be chosen to be approximately four times the frequency about which most of the energy of the signal is clustered. Where S(t) is a frequency modulated carrier of frequency $f_c$, the deviation of the instantaneous frequency of S(t) is given by equation (4) with appropriate values of x and y from equation (7) substituted into equation (4).

Consider sampling the signal described by equation (7) at four successive times $T_{n-1}=0$, $T_n=1/f_s$, $T_{n+1}=2T_n=2/f_s$ and $T_{n+2}=3T_n=3/f_s$ to produce the respective samples $S_{n-1}$, $S_n$, $S_{n+1}$ and $S_{n+2}$. Substituting the listed times for t in equation (7) shows that samples $S_{n-i}$ contain information of the x(t) component only, for the index "i" being odd and information of the y(t) component only, for the index "i" being even. A set of four successive samples, $S_{n-i}$, thus have the correspondance $S_{n-1}=x_{n-1}$; $S_n=-y_n$; $S_{n+1}=-x_{n+1}$; and $S_{n+2}=y_{n+2}$. Alternate x samples are of opposite polarity to the corresponding S-samples and alternate y samples are of opposite polarity to corresponding S samples. Adjacent samples have a 90 degree phase relationship or may be said to be orthogonal. The sample-time relationship is illustrated in Table II below.

TABLE II

| SAMPLE TIMES | $T_{n-1}$ | $T_n$ | $T_{n+1}$ | $T_{n+2}$ |
|---|---|---|---|---|
| | 0 | $1/f_s$ | $2/f_s$ | $3/f_s$ |
| SAMPLE | $S_{n-1}$ | $S_n$ | $S_{n+1}$ | $S_{n+c}$ |
| VALUES | $x_{n-1}$ | $-y_n$ | $-x_{n+1}$ | $y_{n+2}$ |
| x, y averages | | $\bar{x}_n$ | $\bar{y}_n$ | |
| x, y derivatives | | $\dot{x}_n$ | $\dot{y}_n$ | |

The following sampling procedure and sample manipulation will generally apply if the sample rate $f_s$ differs from four times the carrier rate, $f_c$, of an FM signal by approximately 20 percent or less. This feature permits sampling of the FM signal assynchronously. Assynchronous sampling does produce a DC offset which is related to the differential of the carrier frequency from one fourth the sampling frequency but this offset is easily compensated. Admittedly demodulation by synchronous sampling ultimately produces a more accurate rendition of the modulating signal, but the slight AC error attendant assynchronous sampling is more than offset by the reduced number of circuit elements required.

Recall equation (4) for the frequency deviation $$F(t)=(1/2\pi)(x\dot{y}-y\dot{x})/(x^2+y^2) \quad (4)$$

For a system which sequentially takes x and y samples, at any particular sample time, only an x or only a y signal sample is obtained. Thus there are no simultaneously sampled x and y samples for use in equation (4). However, if the carrier frequency is substantially larger than the highest modulating frequency F(t), the use of average values $\bar{x}$ of successive x samples and average values $\bar{y}$ of successive y values can be utilized to closely approximate the x and y factors, i.e., $$\bar{y}=(S_{n+2}-S_n)/2 \quad (7)$$

$$\bar{x}=(S_{n-1}-S_{n+1})/2. \quad (8)$$

The minus sign in the equations (7) and (8) account for the polarity reversal of alternate samples of the same components. The first derivatives y and x of the y(t) and x(t) components may be approximated using the simple differences of successive y and successive x samples.

$$\dot{y}\cong(S_n+S_{n+2})f_s/2 \quad (9)$$

$$\dot{x}\cong-(S_{n+1}+S_{n-1})f_s/2 \quad (10)$$

where $f_s$ equals the sampling frequency. Substituting equations (7)–(10) in (4) the frequency deviation $F_n$ is given by $$F_n=f_s/\pi(S_{n-1}S_{n+2}-S_nS_{n+1})/((S_{n-1}-S_{n+1})^2+(-S_n-S_{n+2})^2) \quad (11)$$

The timing relationship of the average values $\bar{x}_n$, $\bar{y}_n$ and the derivatives $\dot{x}_n$, $\dot{y}_n$ substituted in equation (4) for determination of the sample values $F_n$ when the x and y samples are obtained by sequential sampling are shown in Table II. In the table, the average values $\bar{x}$ and $\bar{y}$ have been placed midway between the samples used in their calculation because on average it is at that point in time that that value would actually tend to occur. Similarly, the values of the derivatives are placed in time midway between the values used in the differences since the calculated slope will most nearly represent the slope of the actual signal at that point in time.

Cross multiplying the averages $\bar{x}$ and $\bar{y}$ derived from equations (7) and (8) by the derivatives $\dot{y}$ and $\dot{x}$ derived from equations (9) and (10) tends to produce sampled values $F_n$ defined by equation (11) which are timed midway between the samples utilized for calculating a particular value of $F_n$.

The FIG. 2 apparatus operates on an FM signal to produce the demodulated signal samples described by equation (11). The FM signal to be demodulated is applied to terminal 50. This signal may have been previously heterodyned to reduce the carrier frequency to a frequency range susceptible of processing by the particular circuitry. The FM signal is assynchronously sampled and digitized to e.g. pulse code modulated (PCM) format in the analog-to-digital converter (ADC) 51. The sample rate, $f_s$, is determined by oscillator 52 and is approximately four times the carrier frequency $f_c$. The PCM samples from ADC 51 are successively delayed in the cascaded delay elements 53, 54 and 55 each of which delays the samples one sample period. PCM samples from the ADC 51 output connection and the output connections of delay elements 53, 54 and 55 respectively correspond to samples $S_{n+2}$, $S_{n+1}$, $S_n$ and $S_{n-1}$. These sample values are applied in parallel to the arithmetic processor 56 which produces demodulated output samples $F_n$ having values corresponding to the equation (11). The processor 56 may be a microprocessor programmed to perform the requisite function.

FIG. 3 is a hardware implementation of the invention which may be realized with either analog or digital circuit elements. In the analog embodiment the signal is processed in sampled data format while the digital embodiment will utilize e.g. conventional binary circuit elements.

FM signal to be demodulated is applied at terminal 60 and is sampled by element 61. If the circuit is analog, element 61 may be a simple sample-and-hold circuit. On the other hand, if the signal is to be processed digitally, element 61 may be an ADC. The sampled signal is applied to cascaded delay elements 62, 63 and 64 which successively delay the signal samples by one sample period. Delay stages 62-64 and element 61 are driven by a clock, $\phi$, operating at a frequency at or about four times the FM signal carrier frequency. Output signals from elements 64, 63, 62 and 61 correspond to signal samples $S_{n-1}$, $S_n$, $S_{n+1}$ and $S_{n+2}$ respectively. Signal samples $S_{n+2}$ are subtracted from signal samples $S_n$ in circuit element 65, and samples $S_{n+1}$ are subtracted from samples $S_{n-1}$ in element 66. The differences from circuit elements 65 and 66 are respectively squared in multipliers 67 and 68. The squared values are then applied as input samples to ADDER 72 which outputs sample values corresponding to the denominator of equation (11).

Samples $S_n$ and $S_{n+1}$ are applied to multiplier element 69 which generates their product, and samples $S_{n-1}$ and $S_{n+2}$ are multiplied together in multiplier 71. The product samples from multiplier 69 are subtracted from the product samples from multiplier 71 in subtractor element 70, the differences corresponding to the numerator of equation (11). Sample differences from subtractor 70 are applied to circuit element 73 wherein they are divided by sum samples from ADDER 72. Output signal available at connection 74 corresponds to sample values as described by equation (11).

For the condition that the amplitude of the FM input signal is maintained constant, the output signal from subtractor circuit 70 corresponds substantially to the desired demodulated signal scaled by a constant value. In this instance it is not necessary to develop the signal corresponding to the denominator of equation (11) for division of sample values from element 70.

The approximation of demodulated samples $F_n$ can be further refined by including one more sample value in the calculation. In this instance, the instantaneous frequency values are represented by, $$F_n = \frac{(f_s)}{\pi} \frac{(4S_n(S_{n+1} + S_{n-1}) + (S_{n+1} - S_{n-1})(S_{n+2} - S_{n-2}))}{4S_n^2 + (S_{n+1} - S_{n-1})^2} \quad (12)$$

The derivation will be explained with reference to Table III which shows the correspondence between samples and x and y values.

TABLE III

| SAMPLE | $T_{n-2}$ | $T_{n-1}$ | $T_n$ | $T_{n+1}$ | $T_{n+2}$ |
|---|---|---|---|---|---|
| TIMES | $-2/f_s$ | $-1/f_s$ | 0 | $1/f_s$ | $2/f_s$ |
| SAMPLE | $S_{n-2}$ | $S_{n-1}$ | $S_n$ | $S_{n+1}$ | $S_{n+2}$ |

TABLE III-continued

| VALUES | $-x_{n-2}$ | $y_{n-1}$ | $x_n$ | $-y_{n+1}$ | $-x_{n+2}$ |
|---|---|---|---|---|---|

The values for $x_n$, $y_n$, $\dot{x}_n$ and $\dot{y}_n$ to be substituted into equation (4), are chosen to be centered equidistant in time about a particular sample $S_n$. Thus, the sample value for $x_n$ is the sample $S_n$. The value for $y_n$ is the average of samples $y_{n-1}$ and $+y_{n+1}$ or $(S_{n-1} - S_{n+1})/2$. The derivative $\dot{y}_n$ is proportional to $$y_{n+1} - y_{n-1} \text{ or } -(S_{n+1} + S_{n-1})(f_s/2)$$

and the derivative $\dot{x}_n$ is proportional to $$-(S_{n+2} - S_{n-2})(f_s/4).$$

The equivalent of the center of mass of the y value will tend to lie near time $T_n$ and the derivatives x and y will tend to represent the slope between the respective points most accurately at time $T_n$. All of the terms chosen for use in equation (4) tend to have values representative of time $T_n$. When the foregoing terms are substituted into equation (4) and the terms multiplied and collected, equation (12) results. It has been determined that the values $F_n$ produced in accordance with equation (12) are significantly more accurate than those produced according to equation (11). As was the case with the four sample system, if the amplitude of the input signal remains constant, the denominator of equation (12) may be disregarded.

The result of equation (12) may be provided with the FIG. 2 circuit arrangement by including an additional delay element 58 shown in phantom lines cascaded with delay element 55 for providing the fifth sample value to processor 56. The processor 56 would of course be programmed to produce sample values $F_n$ according to equation (12).

A further improvement in the accuracy of the demodulated signal $F_n$ can be obtained by processing the results $F_n$ of equation (12) according to $$F_n' = (f_s/2\pi) \arcsin(2\pi F_n/f_s) \quad (13)$$

where $F_n'$ are the improved output samples. It can be shown that if $S(t)$ is a sinewave of frequency $(f_c + F) < f_s/2$ equation (13) yields $F_n' = F$ exactly. To compare the results of equations (12) and (13) consider an FM signal on a carrier of 1020 KHz frequency modulated by a 40 KHz sinusoid to peak deviations of ±40 KHz. Employing a sample rate $f_s$ of 4000 KHz and using equation (12) the samples $F_n$ have a maximum error of two parts per thousand and harmonic distortions better than −62 dB. Using equation (13) the samples $F_n'$ have substantially no harmonic distortion.

The function defined by equation (13) may be performed by a Read Only Memory (ROM) which is addressed by the samples $F_n$ and is programmed to output samples corresponding to $\arcsin(2\pi F_n/f_s)$ for applied addresses $F_n$. This device is shown in phantom lines (Box 59) in FIG. 2.

When the carrier frequency of the input FM waveform is much greater than the modulating signal, the demodulation process may be performed on bursts of samples rather than continuously. The only restriction is that the rate of bursts of samples must satisfy the Nyquist criterion with regard to the bandwidth of the intelligence signal which modulates the carrier. Assume that the FM input signal is a 4 MHz carrier modulated with a signal having a 40 KHz bandwidth. To demodulate this signal using simple bursts, the burst rate must be 80 KHz or greater, i.e. at least twice the 40 KHz modulation rate. Each burst must have four (equation 11) or five (equation 12) successive samples which are produced at a 16 MHz rate. This feature allows the actual signal processing (demodulation) to be performed at a rate considerably slower than the sample rate.

FIG. 4 illustrates circuitry of such a sample burst demodulation apparatus. In FIG. 4, the FM signal at connection 80 is applied to a sampling switch SW1. Switch SW1 operatively controlled by the clock source 81 successively applies the input signal to analog signal storage elements C1–C5 at a four times carrier rate. The clock source 81 is gated to provide bursts of six successive pulses of period $1/f_s$ so that a signal sample is applied to each storage element C1–C5 and then to disconnect switch SW1 from all storage elements. The gating pulses are provided by the one shot 87 which is triggered by the divide-by-five circuit 86. Circuit 86 produces an output pulse for every five input pulses applied thereto from clock generator 82.

Clock generator 82 operates at a rate greater than or equal to twice the FM modulation frequency and gates the samples, via switch SW2, from storage elements C1–C5 to the ADC 83. The ADC generates the binary equivalents of the samples under the control of clock source 82. The binary signals are successively stored in the delay element 84 and subsequently applied to processor 85 which calculates the values $F_n$ according to equation (11) or (12).

The storage elements shown in FIG. 4 are five parallel capacitors. An alternate analog sample store may comprise a serial charge transfer device e.g. CCD or BBD which has an input terminal connected for applying the FM signal, an output terminal connected to the ADC, and a clock input which is alternately clocked at the fast rate for five sample periods to load a burst of samples and then at the slow rate for five sample periods to output the samples of the ADC. It will be appreciated by those skilled in the art of signal multiplexing that if the sample rate, i.e. the fast rate, is much greater than the slow rate, a single charge transfer device will suffice. If the difference between the two rates is not large then parallel charge transfer devices will be required with the parallel devices alternately sampling and outputting in the so called "ping-pong" manner.

The analog storage elements relax the speed requirements on the ADC. However, if the ADC is sufficiently fast to convert samples at the $4F_c$ rate then the ADC may itself be gated in bursts and the samples stored in digital form in the cascaded delay elements. The subsequent processing circuitry can then perform the calculations over the burst period at the slower rate.

What is claimed is:

1. Apparatus for detecting the instantaneous frequency deviation of a signal having a frequency spectrum centered about the frequency $f_c$, comprising:
   means for sequentially sampling said signal at a sampling rate to produce successive adjacent samples that are substantially orthogonal components of said signal;
   means for storing successive signal samples so that at least four successive signal samples are simultaneously available;
   means responsive to sets of successive samples for successively combining said sets of samples to produce sample values $F_n$ corresponding to differences of cross products of the average values of said orthogonal components times derivatives of said orthogonal components, said values, $F_n$, corresponding to the instantaneous frequency deviation of said signal.

2. The apparatus set forth in claim 1 wherein successive samples are denoted $S_{n-1}$, $S_n$, $S_{n+1}$ and $S_{n+2}$, and said means for producing sample values $F_n$ comprises:
   means for generating the products $S_{n-1}S_{n+2}$ and $S_nS_{n+1}$; and
   means for generating the differences $S_{n-1}S_{n+2} - S_nS_{n+1} = F_n$.

3. The apparatus set forth in claim 2 wherein the said means for producing sample values $F_n$ further comprises:
   means for generating the sample differences $S_{n-1} - S_{n+1}$ and $S_n - S_{n+2}$;
   means for developing the squares of the differences $S_{n-1} - S_{n+1}$ and $S_n - S_{n+2}$;
   means for summing said squares; and
   means for dividing the differences $(S_{n-1}S_{n+2} - S_nS_{n+1})$ by said sums.

4. The apparatus set forth in claim 1 wherein the means for storing comprises at least three clocked delay elements in cascade connection, said delay elements being clocked synchronously with said sampling means.

5. The apparatus set forth in claim 1 wherein said means for sampling includes an analog-to-digital converter.

6. The apparatus set forth in claim 4 wherein successive samples are denoted $S_{n-1}$, $S_n$, $S_{n+1}$ and $S_{n+2}$ and said means for producing sample values comprises a microprocessor programmed to calculate the values $S_{n-1}S_{n+2} - S_nS_{n+1}$.

7. The apparatus set forth in claim 2 wherein the sampling means comprises a sample and hold circuit.

8. The apparatus set forth in claim 7 further comprising:
   respective means for subtracting $S_{n+2}$ samples from $S_n$ samples and $S_{n+1}$ samples from $S_{n-1}$ samples to produce respective difference samples;
   respective means for squaring said respective difference samples;
   means for summing the squared difference samples; and
   means for dividing the sample values $S_{n-1}S_{n+2} - S_nS_{n+1}$ by the sums of the squared differences samples.

9. The apparatus set forth in claim 1 wherein said signal is an FM signal having a carrier frequency $f_c$, with a maximum frequency deviation $f_m$, said apparatus further including:
   means for controlling said sampling means to sample said signal in bursts of at least four successive samples at said sampling rate, said bursts occurring at a rate equal to or greater than twice the frequency deviation $f_m$.

10. The apparatus set forth in claim 1 wherein said signal is an FM signal having a carrier frequency $f_c$ with a maximum deviation $f_m$, and wherein said sampling means includes:
    a plurality of analog storage elements for storing a plurality of analog samples;
    means for periodically applying successive analog samples of said FM signal to respective ones of said plurality of analog storage elements at said sampling rate, the periodicity being greater than or equal to twice the frequency $f_m$; and means for serially combining the analog samples, in the same order they were taken, from said analog storage elements at a rate less than said sampling rate.

11. The apparatus set forth in claim 1 wherein successive samples are denoted $S_{n-2}$, $S_{n-1}$, $S_n$, $S_{n+1}$ and $S_{n+2}$, and said means for producing sample values $F_n$ comprises:

means for producing the sample products $S_n(S_{n+1}-S_{n-1})$ and $(S_{n+1}-S_{n-1})(S_{n+2}-S_{n-2})$;

means for producing sums corresponding to $4S_n(S_{n+1}-S_{n-1})+(S_{n+1}-S_{n-1})(S_{n+2}-S_{n-2})$.

12. The apparatus set forth in claim 11 wherein the means for producing sample values $F_n$ further includes:

means for producing the squares $S_n^2$ and $(S_{n+1}-S_{n-1})^2$;

means for producing the sums $4S_n^2+(S_{n+1}-S_{n-1})^2$; and means for dividing the sums $4S_n(S_{n+1}+S_{n-1})+(S_{n+1}-S_{n-1})(S_{n+2}-S_{n-2})$ by the sums $4S_n^2+(S_{n+1}-S_{n-1})^2$.

13. The apparatus set forth in claim 12 wherein the sampling means includes:

means for sampling said signal in bursts of samples at said sampling rate and wherein the burst rate is equal to or greater than twice the maximum frequency deviation of said signal.

14. The apparatus set forth in claim 12 further including means for processing sample values $F_n$ according to the relation $(f_s/2\pi)$ arcsin $(2\pi F_n/f_s)$ where $f_s$ is the sampling rate.

15. A method for demodulating FM signals comprising:

sampling the FM signal at a rate within a range of $\pm 20$ percent of four times the carrier frequency;

storing successive sample values so that at least four successive samples are simultaneously available, denoted $S_{n+2}$, $S_{n+1}$, $S_n$ and $S_{n-1}$ where $S_{n+2}$ is the most current sample;

processing the samples to produce demodulated samples, $F_n$, corresponding to the differences of the cross products of the average value of said components over said available signals, times the derivatives of said components.

16. The method set forth in claim 15 wherein the processing of samples further provides for dividing the differences of said cross products by the sum of the squares of said average values.

17. The method set forth in claim 15 wherein said processing combines the signal samples according to the equation $$F_n = (S_{n-1}S_{n+2} - S_nS_{n+1})/((S_{n-1}-S_{n+1})^2 + (S_n - S_{n+2})^2).$$

18. The method set forth in claim 15 wherein said processing combines the signal samples according to the equation $$F_n = \frac{4S_n(S_{n+1} + S_{n-1}) + (S_{n+1} - S_{n-1})(S_{n+2} - S_{n-2})}{4S_n^2 + (S_{n+1} - S_{n-1})^2}.$$

* * * * *

UNITED STATES PATENT AND TRADEMARK OFFICE
CERTIFICATE OF CORRECTION

PATENT NO. : 4,547,737

DATED : Oct. 15, 1985

INVENTOR(S) : John J. Gibson

It is certified that error appears in the above-identified patent and that said Letters Patent is hereby corrected as shown below:

On the cover sheet, the title "DEMODULATOR OF SAMPLED DATA FM SIGNALS FROM SETS OF FOUR SUCCESSIVE SAMPLES" should be --APPARATUS FOR DEMODULATING SAMPLED DATA FM SIGNALS FROM SETS OF FOUR SUCCESSIVE SAMPLES--.

Column 4, line 19    "y and x" should be --$\dot{y}$ and $\dot{x}$--.

Column 6, line 19    "x and y" should be --$\dot{x}$ and $\dot{y}$--.

Signed and Sealed this

Eleventh Day of February 1986

[SEAL]

Attest:

DONALD J. QUIGG

Attesting Officer    Commissioner of Patents and Trademarks